United States Patent [19]

Caporiccio et al.

[11] Patent Number: 5,334,454
[45] Date of Patent: Aug. 2, 1994

[54] ARTICLES BY PLASMA-ACTIVATED CHEMICAL VAPOR DEPOSITION OF FLUORINATED CYCLIC SILOXANES

[75] Inventors: Gerardo Caporiccio, Milan; Riccardo D'Agostino; Pietro Favia, both of Bari, all of Italy

[73] Assignee: Dow Corning Corporation, Midland, Mich.

[21] Appl. No.: 20,491

[22] Filed: Feb. 22, 1993

Related U.S. Application Data

[62] Division of Ser. No. 916,647, Jul. 20, 1992, Pat. No. 5,230,929.

[30] Foreign Application Priority Data

Jul. 22, 1991 [IT] Italy .......................... MI91A002018

[51] Int. Cl.$^5$ .............................................. B32B 27/36
[52] U.S. Cl. ................................. 428/412; 427/109; 427/167; 427/489; 427/490; 427/491; 427/578; 428/421; 428/428; 428/446; 428/523
[58] Field of Search .............. 427/489, 490, 491, 578, 427/167, 109; 428/412, 421, 428, 446, 523

[56] References Cited

U.S. PATENT DOCUMENTS 4,643,948  2/1987  Diaz et al. .................... 427/489 X

*Primary Examiner*—Bernard Pianalto
*Attorney, Agent, or Firm*—Roger E. Gobrogge

[57] ABSTRACT

The present invention refers to the deposition of thin film coatings produced by plasma-activated chemical vapor deposition of volatile fluorinated cyclic siloxanes of the structure $[RR'SiO]_x$, in which R is a hydrocarbon radical with 1-6 carbon atoms, R' is a fluorinated hydrocarbon radical with 3-10 carbon atoms, the carbon in the alpha and beta positions with respect to the silicon atom is hydrogenated and x is 3 or 4.

8 Claims, No Drawings

ARTICLES BY PLASMA-ACTIVATED CHEMICAL VAPOR DEPOSITION OF FLUORINATED CYCLIC SILOXANES

This is a divisional of copending application(s) Ser. No. 07/916,647 filed on Jul. 20, 1992 and now U.S. Pat. No. 5,230,929.

BACKGROUND OF THE INVENTION

The present invention refers to the deposition of thin film coatings produced by the plasma-activated chemical vapor deposition of volatile fluorinated cyclic siloxanes having the structure $[RR'SiO]_x$, where R is an alkyl group with 1-6 carbon atoms, R' is a fluorinated alkyl group with 3-10 carbon atoms, the carbon in the alpha and beta positions with respect to the silicon atom is hydrogenated and x is 3 or 4. The process consists of introducing vaporized siloxane into a deposition chamber containing the substrate to be coated. The reaction of the vapor is then induced by means of a plasma that has been excited by radio-frequency (RF) electric field. The particular coatings thus produced have useful physical properties.

Plasma-activated chemical vapor deposition of thin films using gases or chemical vapors is a well-known technique in the field of film formation for coating various substrates. Numerous chemical vapors useful in this technique which allow the formation of various films are known. For example, thin films containing silicon and carbon can be obtained by means of plasma-activated chemical vapor deposition from mixtures of silane ($SiH_4$)-methane or silane-ethylene, as well as from mixtures of tetramethylsilane-argon. Similarly, the production of silicon oxide-type films from silanes (for example, $SiH_4$, $H_2SiCl_2$, etc. ) mixed with an oxidizing gas (for example, air, oxygen, ozone, $NO_2$, etc. ) is known.

What was not yet known, however, is that volatile fluorinated cyclic siloxanes could be used as gaseous sources for plasma-activated chemical vapor deposition to obtain fluoropolymer films containing silicon.

SUMMARY OF THE INVENTION

The present invention refers to a method for the formation of a coating over a substrate. The method consists of introducing a sufficient quantity of vapor comprised of a fluorinated cyclic siloxane with the structure $[RR'SiO]_x$ in a deposition chamber containing the substrate, in which R is s hydrocarbon radical with 1-6 carbon atoms, R' is a fluorinated hydrocarbon radical with 3-10 carbon atoms, the carbon in the alpha and beta positions with respect to the silicon atom is hydrogenated and x is 3 or 4. The decomposition reaction of the vapor in the chamber is then induced by the effect of the discharge of the plasma excited by radio frequencies (RF) in the chamber.

The present invention also refers to coatings produced by means of the deposition of thin films formed by plasma-activated chemical vapor deposition of volatile fluorinated cyclic siloxanes having the structure $[RR'SiO]_x$, where R is an alkyl group with 1-6 carbon atoms, R' is a fluorinated alkyl group with 3-10 carbon atoms, the carbon in the alpha and beta positions with respect to the silicon atom is hydrogenated and x is 3 or 4. These particular coatings are useful because of their properties of protection and insulation.

DETAILED DESCRIPTION OF THE INVENTION

The present invention is based on the discovery that particular coatings can be formed from vapors of fluorinated cyclic siloxanes. The coatings are formed over the substrates when a discharge of a plasma excited by radio frequencies induces the reaction of the siloxane vapor which, in turn, deposits the polymer film on the surface of the substrate.

The chemical vapors or the source gases that are used in the present method consist of fluorinated cyclic siloxanes. More specifically, the source gases are fluorinated cyclic siloxanes having the structure $[RR'SiO]_x$, where R is a hydrocarbon radical with 1-6 carbon atoms, R' is a fluorinated hydrocarbon radical with 3-10 carbon atoms, the carbon in the alpha and beta positions with respect to the silicon atom is hydrogenated and x is 3 or 4. Examples of these materials include 2,4,6-tri(3,3,3-trifluoropropyl )-2,4,6-trimethylcyclotrisiloxane and 2,4,6-tri(3,3,4,4,5,6,6,6 nonafluorohexyl)-2,4,6 trimethylcyclotrisiloxane. The preferred siloxane for use in this invention is 2,4,6-tri(3,3,3-trifluoropropyl)-2,4,6-trimethylcyclotrisiloxane.

These siloxanes and methods for their production are well-known in the field and many siloxanes are available on the market.

The siloxanes mentioned are used as vapors in the process of the present invention. These vapors are generally obtained by heating the siloxane to a temperature usually between about 50° and 200° C. The vapors thus obtained are then in general diluted with other gases such as inert transport gases (for example, argon, helium, etc.) or other gases that can modify the composition of the thin film. As an alternative, a transport gas like argon or helium can be saturated with the vapor of the liquid siloxane heated to a temperature of about 50° to 200° C.

The total pressure of the gas introduced into the deposition chamber should be controlled at a level that will facilitate discharge of the plasma and provide a reasonable rate of deposition of the coating. The pressures can be varied within a broad range, depending on the specific frequency used in the plasma. Generally, a total pressure of 0.01 to about 10 tort provide conditions favorable to the process of deposition. A total pressure of 0.05 to about 1 tort is preferred; a total pressure of about 0.1 torr is preferred over the others.

The quantity of chemical vapor introduced into the chamber containing the plasma discharge should be sufficient to provide a partial pressure suited to the vacuum condition described above. Consequently, the quantity of vapors introduced should be regulated to provide a total pressure in the chamber ranging from 0.01 to 10 tort; pressures from 0.05 to 1 torr are preferred. The process can be conducted under static conditions, but usually continuous introduction of a controlled quantity of vapor into one part of the chamber is preferred while creating a vacuum in another part of the chamber so as to cause a flow of vapor through the plasma-discharge area. A sufficient quantity of vapor to provide a vapor pressure of about 0.01 to 10 torr in the chamber is introduced continuously, whereas support gases, gaseous products, or other modified gasses are continually extracted from the chamber at a corresponding rate.

The vapor introduced into the chamber is then submitted to a plasma discharge by RF. This discharge is generally produced by means of an ac generator that provides a radio frequency between about 1 and 100 MHz, with a power at the exit between 1 and 1000 W. Particularly preferred are the plasma conditions obtained with a radio frequency between about 13.56 and 27 MHz and a power between about 20 and 200 W.

The temperature of the substrate inside the chamber is generally controlled to facilitate the deposition of the film. Generally, temperatures ranging from room temperature up to about 300° C. are used.

The deposition chamber can also be modified without affecting the present invention. For example, the siloxane vapors can be exposed to the plasma discharge in a position far from the substrate and the reaction products can subsequently be directed onto the substrate. Analogously, the geometry of the discharge can be a configuration with a diode or triode reactor and/or the substrate can be maintained at a negative polarization induced by RF (understood as "bias voltage") applied during deposition. Such negative polarization ("Bias voltage") can vary between 0 and $-100$ V (minus 100 V).

The character and properties of the coatings deposited by means of the method of the present invention can vary within a wide range. For example, the coatings can be modified by changing conditions such as the temperature of the substrate, the voltage of the negative polarization applied to the substrate, the applied power, the feed gas, the geometry of the discharge, etc. The attached examples present a number of these deposition conditions.

The resulting coatings can be produced in many thicknesses, ranging from about 200 up to 20,000 Å.

Films or coatings obtained according to the invention include carbon, silicon, oxygen, hydrogen, and fluorine, at the following approximate atomic percentages (determined with X-ray photoelectron spectrography (XPS)):

| Carbon: | 30-60% |
| Silicon: | 10-25% |
| Oxygen: | 10-35% |
| Fluorine: | 10-36.5% |

Furthermore, hydrogen is also present in the coatings (as confirmed by the C-H signals in the infrared spectral analysis (FTIR type) but cannot be quantified using XPS. Particularly noteworthy is the fact that the infrared spectral analysis (FTIR) does not indicate Si-F or Si-H signals as present in the coating.

These coatings have many desirable characteristics, such as high hardness, very low porosity, good adhesion to the substrates, high index of refraction, hydrophobicity, good characteristics of insulation, transparency and a lack of coloration. For example, the hardness of these coatings deposited on a glass substrate, as measured by ASTM D3633 pencil test, was 2B-9H; the hardness of those deposited on a silicon wafer was 2H-4H (the films classified in the H range are highly scratch-resistant). Similarly, the hydrophobicity, as measured by the angle of contact of a sessile drop of water deposited onto a substrate of glass coated with the film, was between 75° and 95°. The film also has good dielectrical properties with a specific electrical conductivity between about $0.7 \times 10^{-9}$ and about $17 \times 10^{-9}$ ohm$^{-1}$cm$^{-1}$ when deposited onto a glass substrate. Finally, the index of refraction of the coatings, measured in the visible region over a glass substrate, was between about 1.80 and 2.0.

When these characteristics are present simultaneously in the coatings of the present invention, they are useful for coating various types of substrates such as silicon wafers, glasses, ceramics, metals, and polymeric materials. For example, the presence of transparency and high hardness allows the films to be used as scratch-resistant coatings over a large number of plastic materials such as polycarbonate, polymethyl methacrylate, polyethylene, polypropylene, polyethylene terephthalate, and on some of their alloys and mixtures when they are molded or extruded in sheets, laminates, or plates used as glasses or screens of an organic polymer. Analogously, when the coatings are hydrophobic, transparent and colorless, they are useful in improving the sealing characteristics of materials for the packaging of food and pharmaceutical products. When the coatings are hydrophobic, transparent, colorless and having a high index of refraction and high hardness, they are useful for insulating glasses such as building facades, for example. When the coatings are transparent, colorless and have a high index of refraction and high hardness, they are useful as antiscratch coatings for ophthalmic lenses made of plastic or with soft mineral glasses with a high index of refraction. Finally, the combination of good characteristics of electrical insulation, hydrophobicity and high adhesion makes the coatings useful as an insulating, protective layer for microelectronics.

The following nonlimiting examples are provided so that an expert in the field may easily understand the invention.

EXAMPLE 1

A substrate of polished glass was placed on top of the grounded electrode of a diode-shaped plasma rector and was connected to a radio-frequency generator of 13.56 MHz. 2,4,6-tri(3,3,3-trifluoropropyl )-2,4,6-trimethylcyclotrisiloxane was heated to 50° C. and introduced into the reactor, transported by a flow of argon at a rate of 6 seem. The temperature of the substrate was maintained at 30° C. and the pressure in the reactor was maintained at 0.1 torr. The discharge of the plasma was started at 50 W and the thickness of the film was continuously monitored using laser interferometry. After 15 min the electrical supply was interrupted.

The coating, 1 μm thick, had the following characteristics:

- the angle of contact of a sessile water drop deposited onto the film was 91°;
- the hardness, measured with the ASTM D3363 "pencil test," corresponded to classification 2B;
- the electrical conductivity was $1.7 \times 10^{-9}$ ohm$^{-1}$cm$^{-1}$; and
- the index of refraction, determined by the Manifacier-Gaslot method, was 1.95 at 630 nm (25° C.) (see J. Physics, E: Scientific Instruments, 9, 1002, 1976).

EXAMPLE 2

A substrate of polished glass was placed in the same plasma reactor with the same conditions as in Example 1, except that the reactor was assembled with a triode configuration. The substrate was placed on the third electrode, connected to the radio frequency source and maintained at 30° C., with application of a polarization voltage of $-50$ V. After 16 min. the electrical feeding was interrupted.

The resulting coating, 1.6 μm thick, had the following characteristics:
- the hardness, measured with the ASTM D3363 "pencil test," corresponded to pencil classification 6H;
- the electrical conductivity was $4 \times 10^{-9}$ ohm$^{-1}$cm$^{-1}$; and
- the index of refraction, determined by the Manifacier-Gaslot method, was 1.93 at 630 nm (25° C.).

EXAMPLE 3

A section of a silicon wafer was placed in the same plasma reactor under the same conditions as in Example 2, except that a "bias voltage" of −40 V was applied to the substrate maintained at 30° C. After 10 min the [power] supply was interrupted.

The resulting coating, 1.1 μm thick, had the following characteristics:
- the hardness, measured with the ASTM D3363 "pencil test," corresponded to pencil classification 4H;
- the angle of contact of a sessile water drop deposited onto the film was 89°;
- the X-ray photoelectron spectroscopy (XPS) analysis of the coating indicated the following atomic percentages of elements:

| | |
|---|---|
| Carbon | 31% |
| Oxygen | 22% |
| Fluorine | 31% |
| Silicon | 16% |

Furthermore, the XPS showed a reticulated structure. The FTIR analysis of the coating showed a 3000 cm$^{-1}$ band, indicative of the C-H group, a band from 1000 to 1150 cm$^{-1}$, indicative of O—Si—O, a 1210 cm$^{-1}$ band, indicative of the C-F group, and the absence of bands from 2100 to 2150 cm, indicative of the Si—H groups. The spectral analysis did not show the presence of any Si-F groups.

EXAMPLE 4

A substrate of polished glass was placed in the same plasma reactor under the same conditions as in Example 21 [sic; 2], except that the temperature of the substrate was maintained at 200° C. and the as voltage was −50 V. After 15 min the "bi " electrical supply was interrupted.

The resulting coating, 1.0 μm thick, had the following characteristics:
- the hardness, measured with ASTM D3363 "pencil test," corresponded to pencil classification 9H;
- the index of refraction, determined by the Manilaclef-Gaslot method, was 1.91 at 630 nm (25° C.);
- the angle of contact of a sessile water drop deposited onto the film was 77°.

EXAMPLE 5

A section of a silicon wafer was placed in the same plasma reactor under the same conditions as in Example 2, except that a "bias voltage" of −60 V was applied to the substrate maintained at 30° C. After 10 min. the electrical supply was interrupted.

The resulting coating, 1.5 μm thick, has the following characteristics:
- the hardness, measured with ASTM D3363 "pencil test," corresponded to pencil classification 4H;
- the angle of contact of a sessile water drop deposited onto the film was 82°;
- the X-ray photoelectron spectroscopy (XPS) analysis of the coating indicated the following atomic percentages of elements:

| | |
|---|---|
| Carbon | 42% |
| Oxygen | 18% |
| Fluorine | 25% |
| Silicon | 15% |

The FTIR analysis of the coating showed a 3000 cm$^{-1}$ band, indicative of the C-H group, a band from 1000 to 1150 cm$^{-1}$, indicative of O—Si—O, a 1210 cm$^{-1}$ band, indicative of the C-F group, and the absence of bands from 2100 to 2150 cm$^{-1}$, indicative of the Si-H groups.

EXAMPLE 6

A substrate of polished glass was placed in the same plasma reactor under the same conditions as in Example 2, except that the temperature of the substrate was maintained at 80° C. and the "bias voltage" was −100 V. After 9 min the supply was interrupted.

The resulting coating, 0.76 μm thick, has the following characteristics:
- the hardness, measured with the ASTM D3363 "pencil test," corresponded to pencil classification 5H;
- the angle of contact of a sessile water drop deposited onto the film was 88°; and
- the electrical conductivity was $4 \times 10^{-9}$ ohm$^{-1}$ cm$^{-1}$.

That which is claimed is:

1. A substrate having a coating deposited by a method comprising:
   introducing a sufficient quantity of vapor into a chamber cyclic siloxane with the structure $x$ in which R is a containing the substrate, wherein the vapor comprises a fluorinated hydrocarbon radical with 1-6 carbon atoms, R' is a fluorinated hydrocarbon radical with 3-10 carbon atoms, the carbon in the alpha and beta positions with respect to the silicon atom is hydrogenated and x is 3 or 4; and
   exposing the vapor in the chamber to a radio frequency plasma discharge to cause reaction of the vapor and, thereby, deposition of the coating on the substrate.

2. The coated substrate of claim 1 wherein the fluorinated cyclic siloxane comprises 2,4,6-tri(3,3,3-trifluoropropyl)-2,4,6-trimethylcyclotrisiloxane.

3. The coated substrate of claim 1 wherein the substrate is selected from the group consisting of polycarbonate, polymethyl methacrylate, polyethylene, polypropylene and polyethylene terephthalate.

4. The coated substrate of claim 1 wherein the substrate comprises glass.

5. The coated substrate of claim 1 wherein the substrate comprises an optic lens of plastic or soft mineral glass.

6. The coated substrate of claim 1 wherein the substrate comprises a polymer film for the packaging of food and pharmaceutical products.

7. The coated substrate of claim 1 wherein the substrate comprises a microelectronic device.

8. The coated substrate of claim 1 wherein the substrate comprises an organic polymer glass.

* * * * *

UNITED STATES PATENT AND TRADEMARK OFFICE
CERTIFICATE OF CORRECTION

PATENT NO. : 5,334,454
DATED : Aug. 2, 1994
INVENTOR(S) : Gerardo Caporiccio, et al It is certified that error appears in the above-indentified patent and that said Letters Patent is hereby corrected as shown below:

Column 6, Lines 37 and 38: after the word 'chamber', please remove "cyclic siloxane with the structure $_x$ in which R is a".

Column 6, Line 39: after the word "fluorinated', please insert "cyclic siloxane with the structure $[RR'SiO]_x$ in which R is a".
Col. 6,
Claim 1 should read as follows when corrected:

1. A substrate having a coating deposited by a method comprising:
    introducing a sufficient quantity of vapor into a chamber containing the substrate, wherein the vapor comprises a fluorinated cyclic siloxane with the structure $[RR'SiO]_x$ in which R is a hydrocarbon radical with 1-6 carbon atoms, R' is a fluorinated hydrocarbon radical with 3-10 carbon atoms, the carbon in the alpha and beta positions with respect to the silicon atom is hydrogenated and x is 3 or 4; and

UNITED STATES PATENT AND TRADEMARK OFFICE
CERTIFICATE OF CORRECTION

PATENT NO. : 5,334,454
DATED : Aug. 2, 1994
INVENTOR(S) : Gerardo Caporiccio, et al It is certified that error appears in the above-indentified patent and that said Letters Patent is hereby corrected as shown below:

```
        exposing the vapor in the chamber to a radio frequency
        plasma discharge to cause reaction of the vapor and,
        thereby deposition of the coating on the substrate.
```

Signed and Sealed this

Twenty-fifth Day of June, 1996

Attest:

BRUCE LEHMAN

Attesting Officer     Commissioner of Patents and Trademarks